(12) United States Patent
Geers et al.

(10) Patent No.: US 7,844,131 B2
(45) Date of Patent: Nov. 30, 2010

(54) LITHOGRAPHIC APPARATUS, A DEVICE MANUFACTURING METHOD AND A DEVICE MANUFACTURED THEREBY

(75) Inventors: Melle Cornelis Geers, Maastricht (NL); Enno Van Den Brink, Eindhoven (NL); Eric Maria Geelink, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1133 days.

(21) Appl. No.: 11/509,073

(22) Filed: Aug. 24, 2006

(65) Prior Publication Data
US 2008/0050040 A1 Feb. 28, 2008

(51) Int. Cl.
*G06K 9/36* (2006.01)
(52) U.S. Cl. .................. 382/291; 382/282; 382/283; 382/294
(58) Field of Classification Search .......... 382/291, 382/282, 283, 294
See application file for complete search history.

(56) References Cited

U.S. PATENT DOCUMENTS

| | | | |
|---|---|---|---|
| 6,701,259 B2* | 3/2004 | Dor et al. ................... 702/35 |
| 2002/0187406 A1* | 12/2002 | Magome et al. .............. 430/5 |
| 2006/0126046 A1* | 6/2006 | Hansen ........................ 355/55 |

\* cited by examiner

*Primary Examiner*—Matthew C Bella
*Assistant Examiner*—Mike Rahmjoo
(74) *Attorney, Agent, or Firm*—Pillsbury Winthrop Shaw Pittman LLP

(57) ABSTRACT

A method of forming images on a lithographic substrate is disclosed, the method including grouping a plurality of image regions together to form a combined image, determining or receiving a location at which the combined image is to be positioned on the substrate, calculating locations at which the image regions forming the combined image are to be positioned on the substrate, and using a lithographic apparatus to project the image regions at the calculated locations onto the substrate.

18 Claims, 3 Drawing Sheets

LITHOGRAPHIC APPARATUS, A DEVICE MANUFACTURING METHOD AND A DEVICE MANUFACTURED THEREBY

FIELD

The present invention relates to a lithographic apparatus, a device manufacturing method and a device manufactured thereby.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Typically, a single die is projected on each target portion. In other words, once all of the layers have been projected onto the substrate, each target portion provides, for a single IC (or other device). In some instances more than one IC (or other device) may be provided per target portion. For example, two, three or more ICs may be provided per target portion. In some instances it may be desired to form an IC (or other device) which is larger than the target portion. This may occur when it is not possible to increase the size of the target portion to be the same as the size of the desired device. Where this is the case, two or more images are provided which abut one another, thereby forming the device. At the point at which the target portions abut one another, the functional parts of the device connect with one another. This is known in the art as stitching.

In some instances, where devices are to be projected which comprise more than one target portion, it may be difficult to determine where the devices should be located on the substrate.

SUMMARY

It is desirable to provide, for example, a lithographic apparatus, device manufacturing method and device manufactured thereby for devices which are greater in size than one target portion which overcomes or mitigates a problem associated with the art.

According to an aspect of the invention, there is provided a data carrier comprising software, the software configured to:

group a plurality of image regions together to form a combined image;

determine or receive a location on a substrate at which the combined image is to be positioned;

calculate locations at which the image regions forming the combined image are to be positioned on the substrate based on the location of the combined image; and instruct a lithographic apparatus to project the image regions at the calculated locations onto the substrate.

According to a further aspect of the invention, there is provided a lithographic apparatus provided with software arranged to group a plurality of image regions together to form a combined image, determine or receive a location on a substrate at which the combined image is to be positioned, calculate locations on the substrate at which the image regions forming the combined image are to be positioned, and instruct the lithographic apparatus to project the image regions at the calculated locations onto the substrate.

According to a further aspect of the invention there is provided a method of forming images on a lithographic substrate, the method comprising:

grouping a plurality of image regions together to form a combined image;

determining or receiving a location at which the combined image is to be positioned on the substrate;

calculating locations at which the image regions forming the combined image are to be positioned on the substrate; and using a lithographic apparatus to project the image regions at the calculated locations onto the substrate.

According to a further aspect of the invention, there is provided a device manufactured by a lithographic apparatus which groups a plurality of image regions, determines or receives a location at which the combined image is to be positioned on a substrate, calculates locations on the substrate at which image regions forming the combined image are to be positioned, and then projects the image regions at the calculated locations onto the substrate.

BRIEF-DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
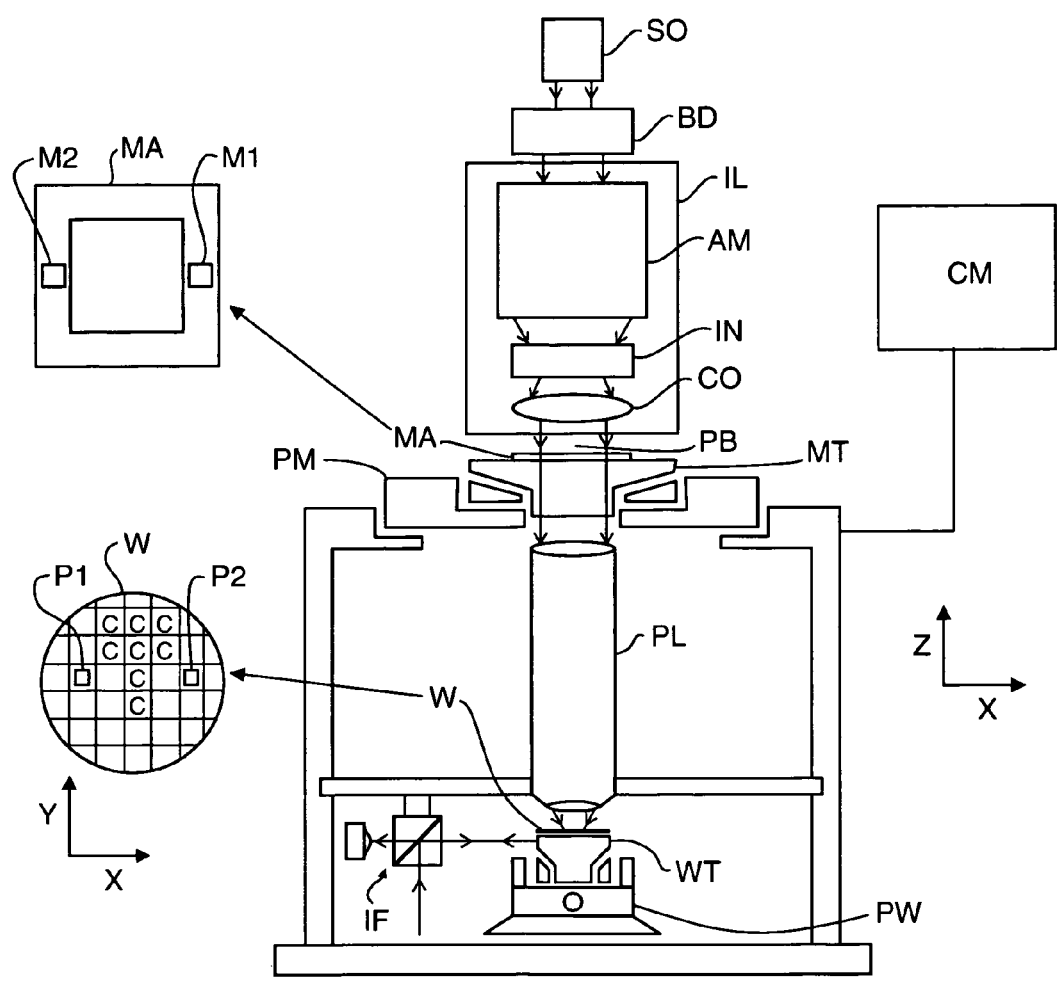
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL to condition a projection beam PB of radiation (e.g. UV radiation or EUV radiation);
- a support structure (e.g. a mask table) MT to support a patterning device (e.g. a mask) MA and connected to first positioning device PM to accurately position the patterning device with respect to item PL;
- a substrate table (e.g. a wafer table) WT to hold a substrate (e.g. a resist-coated wafer) W and connected to a second positioning device PW to accurately position the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB having a desired uniformity and intensity distribution in its cross-section.

The illumination system may also encompass various types of optical components, including refractive, reflective, and catadioptric optical components for directing, shaping, or controlling the beam of radiation, and such components may also be referred to below, collectively or singularly, as a "lens".

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The radiation beam PB is incident on the patterning device (e.g., mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. The positioning device PW may be controlled by a computer CM, such that the substrate W follows a certain exposure route beneath the projection system PL. The first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

The depicted apparatus can be used in the following modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
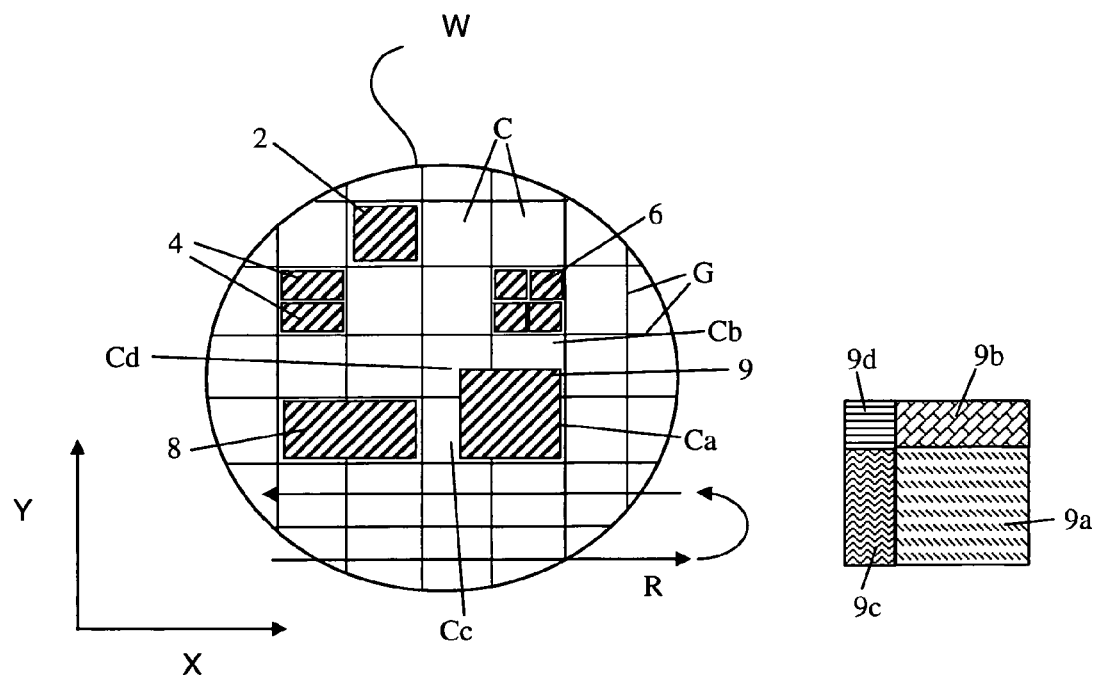
FIG. 2 depicts a substrate onto which dies have been projected.

FIG. 2 shows schematically a substrate W which is separated into a plurality of target portions C. This separation is conventionally performed, prior to projecting onto the substrate W, by software operated by the lithographic apparatus. The processor applies a grid G to the substrate shape (conventional substrates are usually circular and either 200 mm or 300 mm in diameter, although other sizes such as 50 mm, 50.8 mm, 76.2 mm, 100 mm or 125 mm in diameter are also possible).

The most common way of forming the grid G is to separate the substrate W into target portions C which may, for example, correspond with the maximum field size that may be projected onto the substrate by the lithographic apparatus. The grid is typically defined in terms of x,y coordinates (as shown in FIG. 2), which correspond with the directions of movement of the substrate during pattern projection. The grid G may have other dimensions. For example, the target portions C may be smaller than the maximum field size, and the grid G may reflect this.

In a most straightforward scenario, a die is projected which corresponds in size with the target portion C. An example of such a die 2 is shown in FIG. 2. The die is typically slightly smaller than the target portion defined by the grid G, thereby leaving a gap between adjacent projected dies. This gap is commonly referred to as the scribe lane, and allows the substrate to be cut up into separate devices once pattern projection and processing has been completed. Alignment marks or marks intended to provide other information are often projected in the scribe lane at the same time as projecting a pattern of the device 2. The alignment marks and the device 2 all fall within the target portion C.

In some instances, each die may fill only half or less than half of the target portion C. For example, two dies 4 may be provided side by side within a single target portion C. Similarly, four dies 6 may be provided within a single target portion C.

Prior to beginning pattern projecting onto a substrate, the lithographic apparatus determines the locations at which images should be projected. Where a die corresponds in size with a single target portion C, or several dies fall within a single target portion C, this is a straightforward process. The grid G is applied to the substrate in a conventional manner, separating the substrate into individual target portions C which correspond with the maximum field size of the lithographic apparatus. The coordinates of each target portion C are recorded, and a route which allows the image to be projected at each of the target portions is defined. An example of part of a route is shown by arrows R. The route that is used is usually that which give the highest throughput, i.e. that will allow images to be projected onto each target portion C in the shortest possible time.

The size of the target portions C may be adjusted by adjusting the grid G which defines the target portions. However, in general there is an upper limit to the size of the target portion C which may be defined in this way (e.g., the upper limit may be roughly twice the maximum field size of the lithographic apparatus).

In some instances it may be desired to project an image onto a die which is larger than the target portion C. For example, it may be desired to project an image onto a die 8 which occupies two target portions C. The grid G and target portions C are defined in the manner described above. A user of the machine must then input manually into software running on the lithographic apparatus the locations at which images are to be projected. This is not a straightforward task, and the user must find which locations are sufficiently large to receive the image of the die 8, without part of the image of the die overlapping an edge of the substrate such that the die is not properly projected. Once these locations have been determined, the user must input into the lithographic apparatus the positions at which the left hand half of the die is to be projected, and then the positions at which the right hand half of the die is to be projected, together with the identity of the patterning device(s) (e.g., mask(s)) which are to be used. Each position is defined in relation to the grid G. The lithographic apparatus then uses, for example, a first patterning device to project one half of the image, e.g. the left hand half, at the positions input by the user. Subsequently, the lithographic apparatus uses a second patterning device to project the other half of the image, i.e. the right hand half, at the positions input by the user. Provided that the user has input the positions correctly, this process will form a die, which results from a left hand and a right hand image stitched together.

The work required by the user becomes even more complex when a die does not have a size which corresponds with a multiple of target portions, but which instead partially overlaps with one or more target portions. For example, a die 9 may fully occupy a single target portion C, but also overlap with three other target portions. Where this is the case, it becomes very difficult for a user to determine where the dies should be located on the substrate. In some cases the user could adjust the grid size, for example so that the die corresponds in size with four target portions C. However, there may be situations in which this cannot easily be done.

When instructing the lithographic apparatus to project an image onto the die 9, the user must take into account that there are, for example, four separate patterning devices (in some cases there may be more) each bearing a different shaped pattern, and that the patterns must properly abut with one another to form the device. The right hand side of FIG. 2 shows the die 9 in more detail, and it can be seen that the die is formed from four separate regions 9a-d. The user must first determine where on the substrate the die is to be projected. This is not straightforward, and depends on the user selecting positions for each region such that none of the images overlap the edge of the substrate. The user must input into the software the locations at which image 9a is to be projected (together with the identity of the required patterning device), then the locations at which image 9b is to be projected (together with the patterning device identity), etc. The user cannot merely input the location of the relevant target portions, but in addition must indicate where the image is to be positioned within the target portions.

In the example shown in FIG. 2, the first image region 9a is located in a straightforward manner in a first target portion Ca. The second image region 9b however must be located in the lowermost part of a second target portion Cb. Similarly, the third and fourth image regions 9c, 9d must be located respectively to the right and to the bottom right of third and fourth target portions Cc, Cd. In each case the position at which regions are to be projected may be expressed as an offset from a particular location within the target portion, for example a central point of the target portion.

The position on the patterning device of the pattern that forms the image is input into the software. The size of the pattern on the patterning device is also input into the software, optionally together with the identity of the patterning device itself (e.g. an identification number).

The software determines routes to be used during lithographic projection. The software will select routes which provide the best throughput. Typically for a stepper these are routes which involve a small number of changes of direction of movement of the substrate during lithographic projection. For a scanner these are typically routes which involve a small number of changes of direction transverse to the scanning direction, while alternating the scanning direction after each exposure.

It will be appreciated that inputting the required data into the software is a time consuming and difficult process. In some instances errors may arise which lead to unusable dies.

In an embodiment of the invention, the individual image regions are not treated separately in the manner described above. Instead, the combined image formed from the image regions is treated as a single image. Furthermore, the user is not required to input positions in terms of the grid G, but may chose instead to input the position of the combined image using a single set of coordinates (for example substrate coordinates). It will be appreciated that the user may chose to continue to input positions in terms of the grid G if desired.

In one example, the sizes and relative positions of (and optionally one or more identities of one or more patterning devices corresponding to) the four image regions 9a-d which together form the die to be projected, are inputted, for example, by the user, into software running on the computer CM (see FIG. 1). The software groups the four image regions together to form a combined image. The software may be running on the lithographic apparatus (or running on a processor which controls the lithographic apparatus). The user may select locations on the substrate at which the combined image is to be projected. For example, referring to FIG. 3, the user inputs the positions of the twelve dies (combined images). The positions may be defined in terms of substrate coordinates. The substrate coordinates may be, for example, Cartesian coordinates (shown as x,y) with an origin at the center of the substrate. The substrate coordinates could alternatively be x,y coordinates with an origin at some other place on the substrate, e.g. the lowermost point of the substrate (in the y-direction). The substrate coordinates could be expressed as rotational coordinates. The rotational coordinates could, for example, be expressed as a radius and angle relative to an origin, which could be for example the center of the substrate.

The interface of the software may be graphical, to allow the user to see the locations of the combined images on the substrate.

The software may calculate optimum positions for the combined images, instead of the user inputting the positions. This may be done via a comparison of the size of the combined image and the size of the substrate, using conventional mathematical techniques. The software may take into account excluded regions of the substrate, for example an edge portion, onto which it is desired not to project a pattern.

The software converts the positions of the combined images into positions of image regions. The software may do this by separating each combined image into its constituent image regions, and recording the position and identity of each image region. The position of each image region may be retained in terms of the substrate coordinates. Alternatively, the positions of the image regions may be converted so that they are expressed in terms of the grid G. The combined image may be given an identity, for example a reference number. The identities of the image regions may be linked with the identity of the combined image. The image region identities may be the identities of patterning devices on which the image region patterns are provided. The software may also use data which represents the size of the image regions, and the locations of the image region patterns on the patterning devices.

The software determines a route to be used during lithographic projection of the image region patterns onto the substrate. This may take into account effects such as heating of the projection system, heating of the substrate, leveling strategy and stage inaccuracies, as will be described further below. The term 'leveling strategy' is intended to mean that when the route is determined, this takes into account that some routes may allow more accurate compensation for unflatness of the substrate than other routes.

Figure 4:
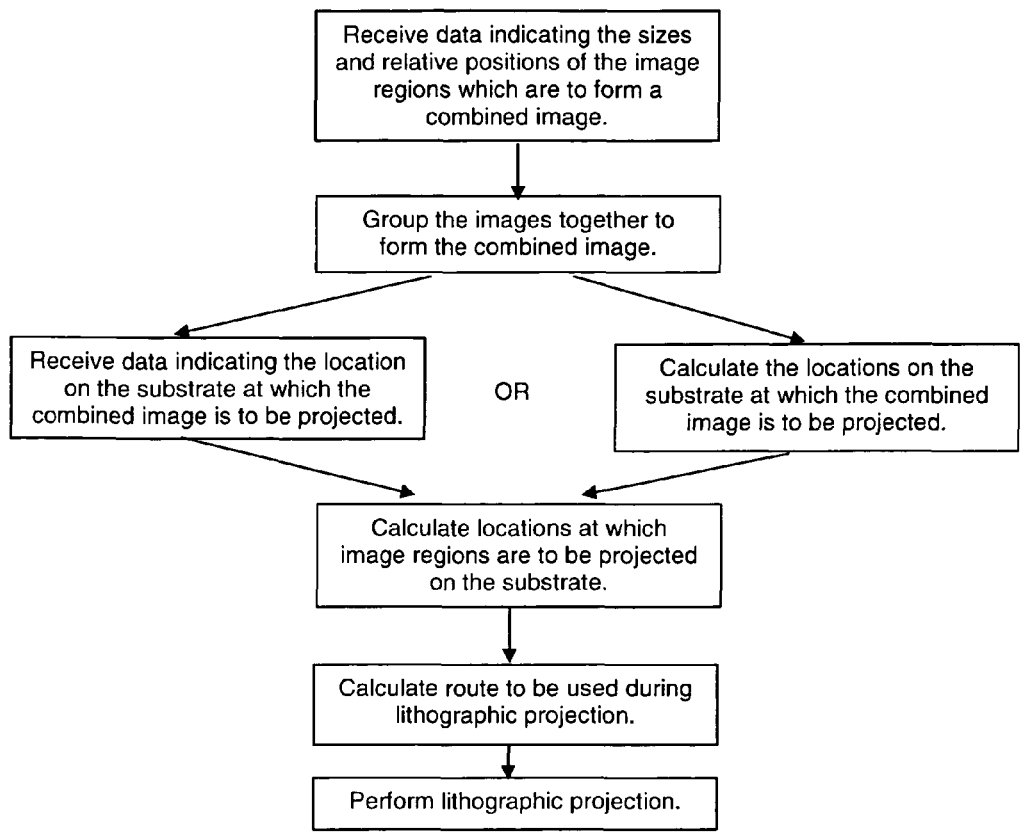
FIG. 4 is a flow chart which depicts operation of an embodiment of the invention.

FIG. 4 is a flow diagram which shows schematically the operation of software according to an embodiment of the invention. The software receives data indicating the sizes and relative positions (and optionally, identities) of image regions which are to form a combined image. It then groups the image regions together to form the combined image. The software then receives data indicating the location on the substrate at which the combined image is to be projected, or calculates appropriate locations. Based upon the locations of the combined images, the software calculates the locations of the image regions. The software then calculates a route to be used during lithographic projection of the pattern(s) corresponding to the image regions onto the substrate, following which lithographic projection is performed.

Figure 3:
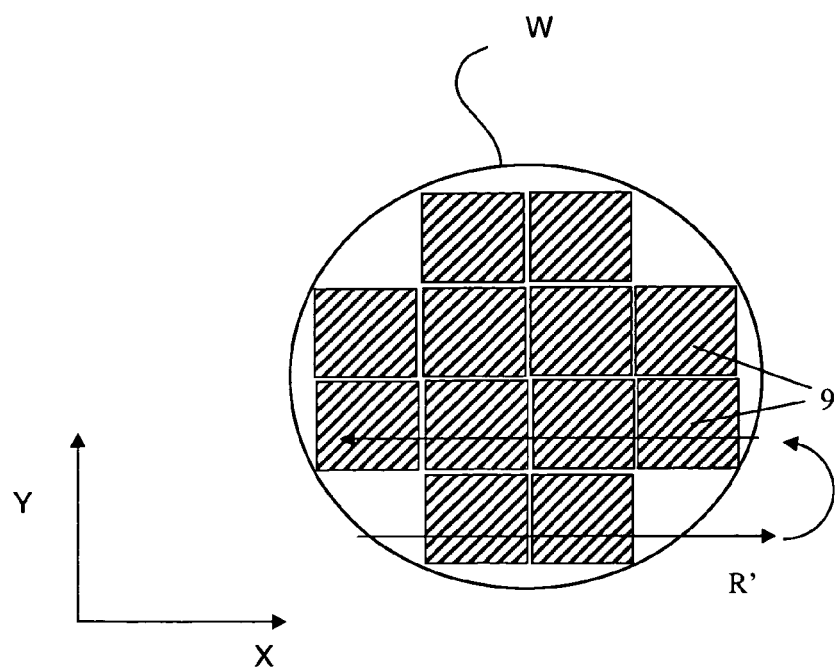
FIGS. 3 and 5 depict substrates onto which dies have been projected according to an embodiment of the invention.

The lithographic apparatus projects each of the image regions onto the substrate, at the locations determined by the software. Typically this is done by projecting a given image region at all desired locations, then projecting the next image region. Referring to FIGS. 2 and 3 in combination, this would for example comprise projecting the first image region 9a at all twelve locations on the substrate, then projecting the second image region 9b at all twelve locations, etc. An example of part of a route that could be used to project the first image region 9a is indicated by arrows R' in FIG. 3.

An embodiment of the invention makes it much easier for the user to input the required data into the software. In addition, it allows the exposure route to be optimized taking into account that the image regions form a combined image, instead of treating each image region separately when determining the exposure route.

As previously mentioned, the software may calculate the optimal locations of the combined images on the substrate. This may be done via a comparison of the size of the combined image and the size of the substrate, and may be performed using conventional mathematical techniques. The calculation may take into account an edge region of the substrate (or other excluded areas) onto which it may be desired not to project images. Since the software treats the combined image as a single entity, it will ensure that all of the combined image is on the substrate. There is a risk that this would not happen if the combined image were not treated as a single entity. For example, if each image region was treated independently, software could determine optimal positions for the first image region without taking into account that other image regions might overlap the edge of the substrate.

Figure 5:
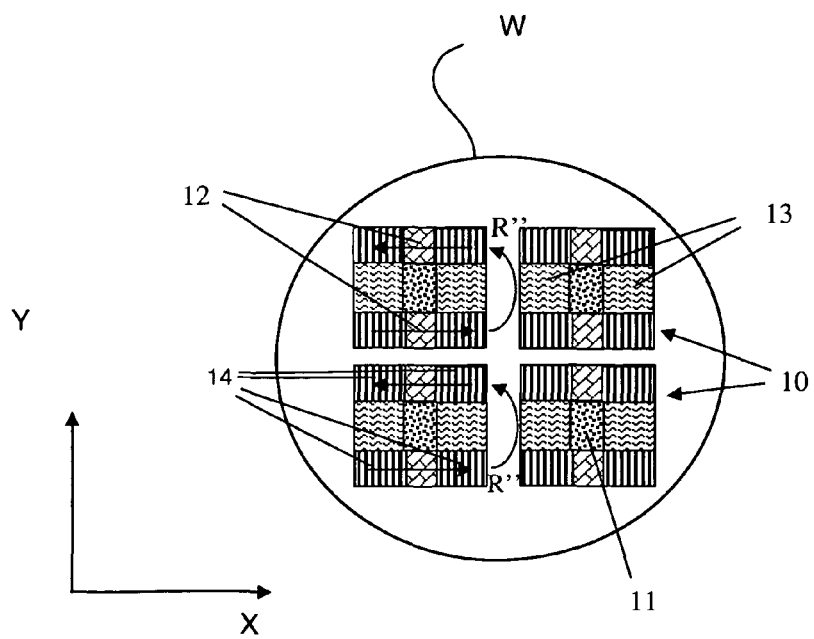

As previously mentioned, the software may calculate an optimal route for pattern projection onto the substrate. This may take into account the fact that the individual image regions together form a combined image, instead of the above described approach in which the image regions are treated as entirely independent and unrelated regions. For example, referring to FIG. 5, a combined image 10 may be formed from a multitude of different image regions 11-14. The image regions in FIG. 4 are a central region 11, upper and lower regions 12, left and right regions 13 and corner regions 14. The upper and lower regions 12 are formed using a same patterning device (i.e. the image is the same, but in a different position in the combined image). Similarly the left and right regions 13 are formed using a same patterning device 14. The corner regions 14 are also formed using a same patterning device.

In order to reduce the risk of stitching errors, it may be desired to project each required image region of a given type at a particular combined image, before moving on to the next combined image. For example, part of a route R" is shown which may be used to project each of the corner regions 14 of a combined image 10, before moving on to the next combined image. An advantage of routing in this manner is that the corner regions 14 of a given image are more likely to have consistent properties than if a different routing had been used. For example, prior art routing would project two corner regions 14 of a first combined image 10 and then project two corner regions of a second combined image, later returning to the first combined image to project the remaining corner regions. In the meantime, properties of the lithographic apparatus, or the substrate may have changed (for example the temperature of the projection system, or the temperature of the substrate). This would cause differences between the size and/or shape of the corner regions projected first and the corner regions projected later, and could reduce the quality of stitching between image regions. An embodiment of the invention reduces these differences by consecutively projecting images of all of the corner regions of the combined image.

The route may also take into account inaccuracies of the positioning of the substrate table (WT in FIG. 1), for example by determining a route in which image regions of a given combined image are projected while the substrate table moves over the minimum distance or with the minimum number of changes of direction.

The software may be instructed to make adjustments to the lithographic apparatus to optimize stitching between adjacent image regions. For example, the focusing, radiation intensity, radiation energy, exposure position, etc. may be adjusted to optimize the stitching. The software may calculate required adjustments based on detected parameters such as the focusing and/or radiation intensity and/or radiation energy when a preceding image region was projected.

Since the embodiment of the invention allows the combined image to be treated as a single entity, rather than having to deal with each image region separately, this allows combined images or groups of combined images to be shifted on the substrate if desired. For example, it may be desired to move a group of combined images in order to make some space available for test features or other structures.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. The description is not intended to limit the invention.

The invention claimed is:

1. A computer readable storage medium that is non-transitory comprising software, the software when executed:
   groups a plurality of image regions together to form a combined image, wherein the combined image is larger than a target portion of a substrate when projected thereon;
   determines or receives locations on the substrate at which the combined image is projected a plurality of times onto the substrate;
   calculates locations at which the image regions forming the combined image are positioned on the substrate when projected thereon based on the locations of the combined image;
   calculates an optimum routing for projecting the image regions onto the substrate, the calculation being constrained such that if a combined image requires a plurality of image regions having the same pattern, all of the image regions for a given combined image are projected consecutively; and
   instructs a lithographic apparatus to project the image regions at the calculated locations onto the substrate.

2. A computer readable storage medium that is non-transitory comprising software, the software when executed:
   groups a plurality of image regions together to form a combined image;
   determines or receives a location on a substrate at which the combined image is positioned when projected onto the substrate;

calculates locations at which the image regions forming the combined image are positioned on the substrate when projected thereon based on the location of the combined image;

instructs a lithographic apparatus to project the image regions at the calculated locations onto the substrate; and calculates an optimum routing for projecting the image regions onto the substrate, the calculation being constrained such that if a combined image requires a plurality of image regions having the same pattern, all of the image regions for a given combined image are projected consecutively.

3. The computer readable storage medium of claim 2, further comprising software that when executed calculates an optimum routing for projecting the image regions onto the substrate, the calculation taking into account at least one of heating of a projection system of the lithographic apparatus, heating of the substrate, leveling strategy, or positional inaccuracy of a substrate table upon which the substrate is supported.

4. The computer readable storage medium of claim 2, wherein the locations at which the combined image may be positioned on the substrate are defined in terms of substrate coordinates.

5. The computer readable storage medium of claim 2, further comprising software that when executed allows a user to input, using a user interface, data to be used by the software.

6. The computer readable storage medium of claim 5, wherein the user interface is a graphical user interface.

7. The computer readable storage medium of claim 2, wherein the software when executed associates an identity with the combined image, and links the identity to identities of the image regions.

8. The computer readable storage medium of claim 7, wherein the image region identities comprise identities of patterning devices which bear image region patterns.

9. The computer readable storage medium of claim 2, further comprising software that when executed adjusts the lithographic apparatus to optimize stitching between adjacent image regions.

10. The computer readable storage medium of claim 9, wherein the adjustment is of at least one selected from the following: focusing, radiation intensity, radiation energy, or exposure position.

11. The computer readable storage medium of claim 2, wherein at least two of the image regions have different patterns.

12. The computer readable storage medium of claim 2, wherein at least two of the image regions have the same pattern.

13. The computer readable storage medium of claim 2, further comprising software that when executed receives identities, sizes and relative locations of the image regions.

14. A lithographic apparatus provided with software that when executed groups a plurality of image regions together to form a combined image, wherein the combined image is larger than a target portion of a substrate when projected thereon, determines or receives a locations on the substrate at which the combined image is projected a plurality of times onto the substrate, calculates locations on the substrate at which the image regions forming the combined image are positioned when projected onto the substrate based on the locations of the combined image, and instructs the lithographic apparatus to project the image regions at the calculated locations onto the substrate, and further comprising software that when executed calculates an optimum routing for projecting the image regions onto the substrate, the calculation being constrained such that if a combined image requires a plurality of image regions having the same pattern, all of the image regions for a given combined image are projected consecutively.

15. The lithographic apparatus of claim 14, further comprising software that when executed calculates an optimum routing for projecting the image regions onto the substrate, the calculation taking into account at least one of heating of a projection system of the lithographic apparatus, heating of the substrate, leveling strategy, or positional inaccuracy of a substrate table upon which the substrate is supported.

16. A method of forming images on a lithographic substrate, the method comprising:

grouping a plurality of image regions together to form a combined image, wherein the combined image is larger than a target portion of the substrate when projected thereon;

determining or receiving locations on the substrate at which the combined image is projected a plurality of times onto the substrate;

calculating locations at which the image regions forming the combined image are positioned on the substrate when projected onto the substrate based on the locations of the combined image;

calculating an optimum routing for projecting the image regions onto the substrate, the calculation being constrained such that if a combined image requires a plurality of image regions having the same pattern, all of the image regions for a given combined image are projected consecutively; and using a lithographic apparatus to project the image regions at the calculated locations onto the substrate.

17. The method of claim 16, further comprising calculating an optimum routing for projecting the image regions onto the substrate, the calculation taking into account at least one of heating of a projection system of the lithographic apparatus, heating of the substrate, leveling strategy, or positional inaccuracy of a substrate table upon which the substrate is supported.

18. The method of claim 16, wherein at least part of the method is performed by software.

* * * * *